US006885040B2

(12) United States Patent
Kim et al.

(10) Patent No.: US 6,885,040 B2
(45) Date of Patent: Apr. 26, 2005

(54) WAVELENGTH-SELECTIVE PHOTO DETECTOR

(75) Inventors: Jun-young Kim, Gunpo (KR); Byoung-lyong Choi, Seoul (KR); Eun-kyung Lee, Suwon (KR)

(73) Assignee: Samsung Electronics Co., Ltd., Kyungki-do (KR)

(*) Notice: Subject to any disclaimer, the term of this patent is extended or adjusted under 35 U.S.C. 154(b) by 0 days.

(21) Appl. No.: 10/747,439

(22) Filed: Dec. 30, 2003

(65) Prior Publication Data

US 2004/0149985 A1 Aug. 5, 2004

(30) Foreign Application Priority Data

Dec. 30, 2002 (KR) .............................. 10-2002-0087155

(51) Int. Cl.⁷ .......................................... H01L 31/0328
(52) U.S. Cl. ...................... 257/186; 257/438; 257/458; 257/80; 257/199; 257/444
(58) Field of Search ........................... 257/431–432, 257/436, 438, 444, 448, 458–459, 195, 199, 184–187, 194, 443, 466, 80, 82; 385/14–15

(56) References Cited

U.S. PATENT DOCUMENTS

| | | | | |
|---|---|---|---|---|
| RE32,893 E | * | 3/1989 | Miller ........................ 257/80 |
| 4,811,069 A | * | 3/1989 | Kakinuma et al. ............ 257/54 |
| 5,296,698 A | * | 3/1994 | Tatoh ...................... 250/214.1 |
| 5,485,302 A | * | 1/1996 | Braun et al. ................. 398/202 |
| 6,252,251 B1 | * | 6/2001 | Bylsma et al. ................ 257/80 |
| 6,399,967 B1 | * | 6/2002 | Matsuda ..................... 257/184 |
| 6,445,020 B2 | * | 9/2002 | Fujimura .................... 257/225 |
| 6,704,472 B2 | * | 3/2004 | Bylsma et al. ................ 385/14 |
| 6,720,589 B1 | * | 4/2004 | Shields ....................... 257/194 |
| 6,791,434 B2 | * | 9/2004 | Tsujiguchi .................. 333/172 |
| 6,798,797 B2 | * | 9/2004 | Mangano et al. ......... 372/29.01 |
| 6,800,533 B1 | * | 10/2004 | Yeo et al. .................... 438/381 |
| 2003/0160596 A1 | * | 8/2003 | Alexander ................... 323/235 |

* cited by examiner

Primary Examiner—Hoai Pham
Assistant Examiner—Thao X. Le
(74) Attorney, Agent, or Firm—Lee, Sterba & Morse, P.C.

(57) ABSTRACT

A wavelength-selective photo detector device includes a transparent upper electrode including a capacitor, a first semiconductor layer disposed under the upper electrode, an optical absorption layer disposed under the first semiconductor layer for absorbing light to form pairs of electrons and holes, an amplification layer disposed under the optical absorption layer for generating secondary electrons, a second semiconductor layer disposed under the amplification layer, and a lower electrode disposed under the second semiconductor layer and including an inductance coupled in parallel with an external resistance. The photo detector improves the S/N ratio and filters only light having a particular wavelength band.

11 Claims, 4 Drawing Sheets

WAVELENGTH-SELECTIVE PHOTO DETECTOR

BACKGROUND OF THE INVENTION

1. Field of the Invention

The present invention relates to a photo detector. More particularly, the present invention relates to a wavelength-selective photo detector with an increased signal to noise (S/N) ratio.

2. Description of the Related Art

Photo detectors are used to detect an optical signal and convert the optical signal to an electrical signal having the same information as the optical signal. Photo detectors may be classified into categories such as detectors that use a pyro-electric effect, which enables photo detection by converting incident infrared rays into a voltage, semiconductor photo detectors that use generation of carriers in a semiconductor by optical absorption, or the like. The semiconductor photo detector may be a diode-type photo detecting device or a photoconductor-type photo detector. Generally, the semiconductor photo detector is formed using silicon and gallium arsenide (GaAs).

FIG. 1 illustrates a schematic conceptual diagram of an avalanche-type semiconductor photo detector.

Referring to FIG. 1, in a conventional avalanche photo detector, an i(Π) optical absorption layer 13 and a p-type amplification layer 15 are interposed between a p$^+$-type electrode 11 and an n-type electrode 17. The p$^+$-type electrode 11 is coupled to an external negative electrode and the n-type electrode 17 is coupled to an external positive electrode. Thus, the avalanche photo detector is driven by applying a strong reverse bias voltage to both ends of the avalanche photo detector.

FIG. 2 illustrates a graph showing the strength of an electric field in the avalanche photo detector where a reverse bias voltage is applied. Referring to FIG. 2, the strongest electric field is applied to the p-type amplification layer 15. The electric field affects movement rates of electrons and holes, which are generated in the optical absorption layer 13.

FIG. 3 illustrates a conceptual diagram showing the electron movement and the hole movement in the avalanche photo detector. Referring to FIG. 3, optical carriers, which are injected by a reverse bias voltage, absorb optical energy in the optical absorption layer 13. Thus, pairs of electrons and holes are generated and accelerated by the reverse bias voltage. The holes are accelerated toward the negative electrode and absorbed into the p$^+$-type electrode 11, while the electrons are accelerated toward the positive electrode and sequentially collide with atoms of the p-type amplification layer 15 where a strong electric field is applied. Thus, secondary electrons are generated to amplify a current. This is called an "avalanche phenomenon."

FIG. 4 illustrates a schematic circuit diagram of an equivalent circuit of the conventional avalanche photo detector as shown in FIG. 1. As shown in FIG. 4, in the conventional avalanche photo detector, noise current $I_{noise}$ and signal current $I_{sig}$ flow through the equivalent circuit.

The avalanche photo detector can detect even an extremely feeble optical signal owing to the avalanche phenomenon. Also, a junction capacitance is small and a responsive characteristic is very good. However, the conventional avalanche photo detector leads not only to heat noise caused by a temperature increase, i.e, a Johnson-Nyquist noise, but also to shot noise caused by the flow of optical current having a wide bandwidth. Thus, the S/N ratio is degraded. To decrease the shot noise, both the bandwidth Δf of a received frequency and dark current of the photo detector should be reduced. Also, when a strong reverse bias voltage is applied to the photo detector, additional problems that are caused by the noise current need to be solved.

SUMMARY OF THE INVENTION

In an effort to solve the problems mentioned above, the present invention provides a photo detector with an increased S/N ratio.

In accordance with a feature of an embodiment of the present invention, there is provided a photo detector device, which includes a transparent upper electrode having a capacitor, a first semiconductor layer disposed under the upper electrode, an optical absorption layer disposed under the first semiconductor layer for absorbing light to generate pairs of electrons and holes, an amplification layer disposed under the optical absorption layer for generating secondary electrons, a second semiconductor layer disposed under the amplification layer, and a lower electrode disposed under the second semiconductor layer and including an inductance coupled in parallel with an external resistance.

Preferably, the capacitor includes a plurality of thin dielectric layers formed between two thin conductive layers and serves as an optical filter that filters light having a particular wavelength band.

The thin conductive layer may be formed of ITO or ZnO.

The thin dielectric layer may be formed of SiO$_2$ or SiN$_x$.

A first bonding pad being in ohmic contact with an external power supply and a second bonding pad being in ohmic contact with the external resistance may be attached to the surface of the upper electrode.

The upper electrode preferably includes a first circular electrode which is formed at the center of the upper electrode where the first bonding pad being in ohmic contact with the external power supply is attached, a second circular electrode which is spaced apart from the first circular electrode by a predetermined distance and formed where the second bonding pad being in ohmic contact with the external resistance is attached, and a circular insulating layer which is disposed between the first circular electrode and the second circular electrode.

The lower electrode preferably includes an insulating layer having a spiral coil to serve as an inductor. Also, a hole may be formed in the lower electrode to be in ohmic contact with an external device.

The first semiconductor layer may be formed of a p$_+$-type semiconductor layer, the amplification layer may be formed of a p-type semiconductor layer, and the second semiconductor layer may be formed of an n-type semiconductor layer.

According to an embodiment of the present invention, the upper electrode includes the capacitor and the lower electrode includes the inductor, thus forming an LC resonance circuit for removing high frequency noise. Also, the capacitor includes a plurality of thin dielectric layers between thin conductive layers to serve as an optical filter that filters only light having a particular wavelength band.

BRIEF DESCRIPTION OF THE DRAWINGS

The above and other features and advantages of the present invention will become more apparent by describing in detail preferred embodiments thereof with reference to the attached drawings in which.

DETAILED DESCRIPTION OF THE INVENTION

Figure 1:
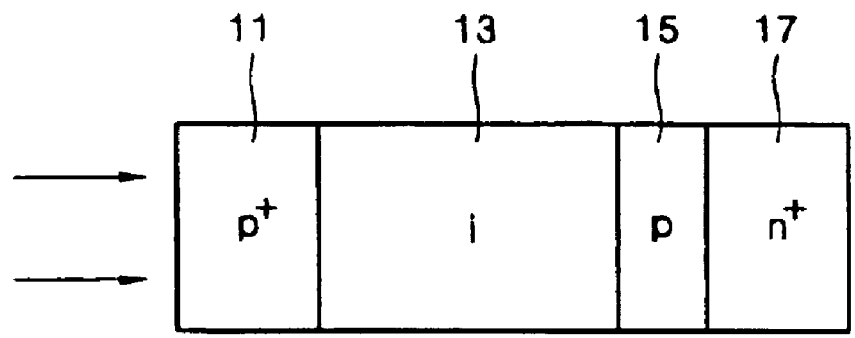
FIG. 1 illustrates a schematic sectional diagram of a conventional avalanche photo detector.
Figure 2:
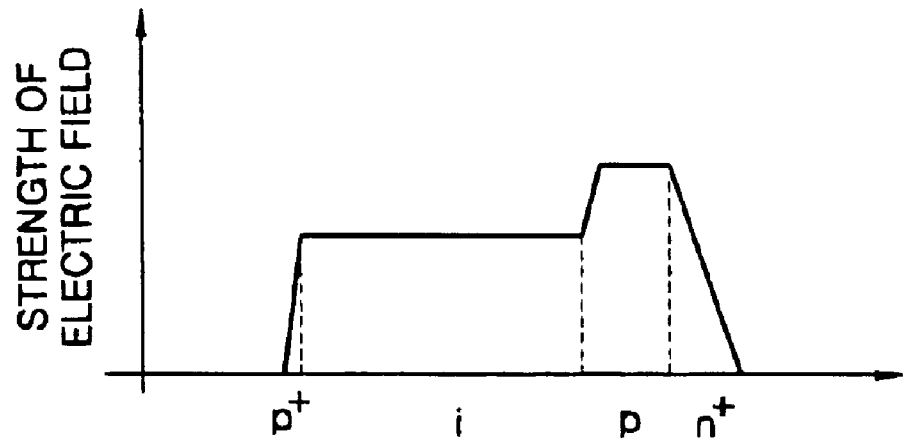
FIG. 2 illustrates a graph showing the strength of an electric field in the avalanche photo detector of FIG. 1.
Figure 3:
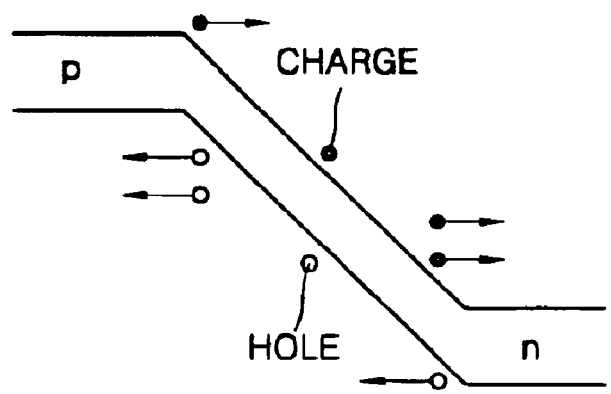
FIG. 3 illustrates a schematic conceptual diagram showing electron movement and hole movement in a the avalanche photo detector of FIG. 1.
Figure 4:
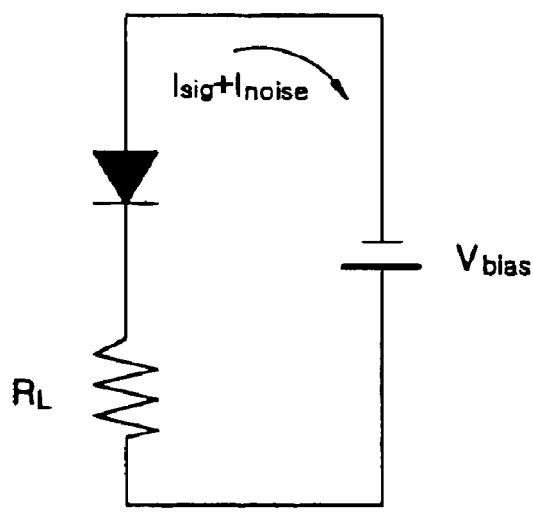
FIG. 4 illustrates a schematic circuit diagram of an equivalent circuit of the conventional avalanche photo detector as shown in FIG. 1.

Korean Patent Application No. 2002-87155, filed on Dec. 30, 2002, and entitled: "WAVELENGTH-SELECTIVE PHOTO DETECTOR", is incorporated by reference herein in its entirety.

A wavelength-selective photo detector according to embodiments of the present invention will now be described in detail with reference to the accompanying drawings. The invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like numbers refer to like elements throughout.

Figure 5:
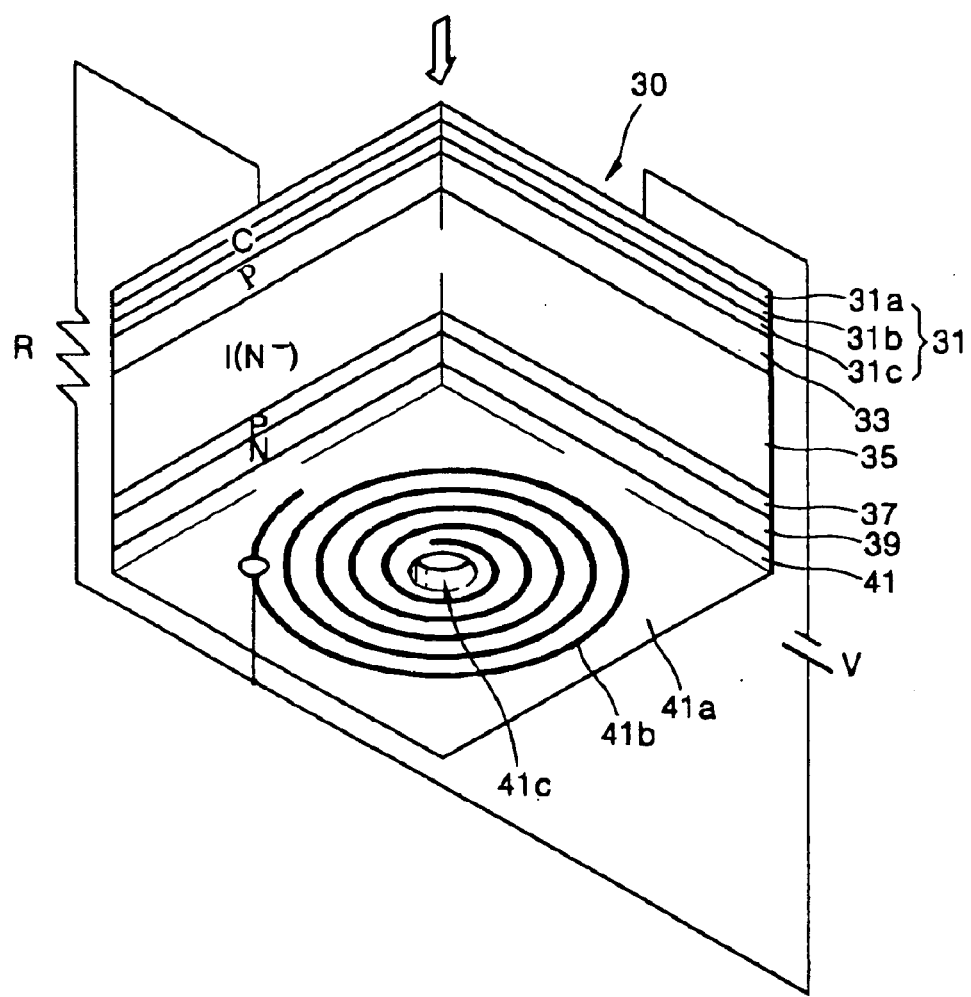
FIG. 5 illustrates a schematic conceptual diagram of a photo detector according to an embodiment of the present invention.

FIG. 5 illustrates a schematic conceptual diagram of a photo detector according to an embodiment of the present invention.

Referring to FIG. 5, the photo detector 30 comprises an upper electrode 31, a first semiconductor layer 33, an optical absorption layer 35, an amplification layer 37, a second semiconductor layer 39, and a lower electrode 41.

The upper electrode 31 includes a capacitor C, which includes a first thin conductive layer 31a, a thin dielectric layer 31b, and a second thin conductive layer 31c, which are stacked. A first circular electrode (not shown) that filters light is disposed at the center of the upper surface of the first thin conductive layer 31a. A circular insulating layer (not shown) is formed to surround the first circular electrode, and a second circular electrode (not shown) is formed outside the circular insulating layer. A bonding pad (not shown) coupled to an external power supply v is attached to the first circular electrode, and a bonding pad (not shown) coupled to an external resistance R is attached to the second circular electrode.

The capacitor C may include a plurality of thin conductive layers 31a and 31c and a plurality of thin dielectric layers 31b. The thin conductive layer(s) 31a may be formed of ITO or ZnO, and the thin dielectric layer(s) 31b may be formed of $SiO_2$ or $SiN_x$. If the first thin conductive layer(s) 31a and the second thin conductive layer(s) 31c are formed of dielectric materials, the capacitor C can serve as an optical filter that selects light having a particular wavelength band and is minimally responsive to light having other wavelength bands.

When the first semiconductor layer 33 is a p-type semiconductor layer, the second semiconductor layer 39 is formed of an n-type semiconductor. The amplification layer 37, interposed between the first and second semiconductor layers 33 and 39, is formed of a p-type semiconductor, and the optical absorption layer 35 is formed of an n-type semiconductor. In a case where the first semiconductor layer 33 is doped with n-type ions, the second semiconductor layer 39, the amplification layer 37, and the optical absorption layer 35 are doped with p-type ions, n-type ions, and p-type ions, respectively.

The lower electrode 41 includes an insulating layer 41a in which a spiral coil 41b is formed, as shown in FIG. 5, to serve as an inductor. A hole 41c is formed at the center of the lower electrode 41 to be in ohmic contact with an external device.

The photo detector according to an embodiment of the present invention includes the upper electrode 31 as the capacitor and the lower electrode 41 as the inductor, thus forming an LC resonance circuit.

If a strong reverse bias voltage is applied to the upper electrode 31, a high-frequency noise element is removed from light that is incident via the upper electrode 31. Then, the light is absorbed in the optical absorption layer 35 via the first semiconductor layer 33. The light absorbed in the optical absorption layer 35 generates pairs of electrons and holes. Here, the electrons move toward the n-type second semiconductor layer 39, whereas the holes move toward the p-type first semiconductor layer 33. While moving toward the n-type second semiconductor layer 39, the electrons collide with atoms of the amplification layer 37 and generate secondary electrons. Thus, a current, which is amplified in proportion to the amount of light received, flows through the photo detector. Afterwards, an optical signal is converted to an electrical signal through the lower electrode 41 to reproduce the information of the optical signal.

Figure 6:
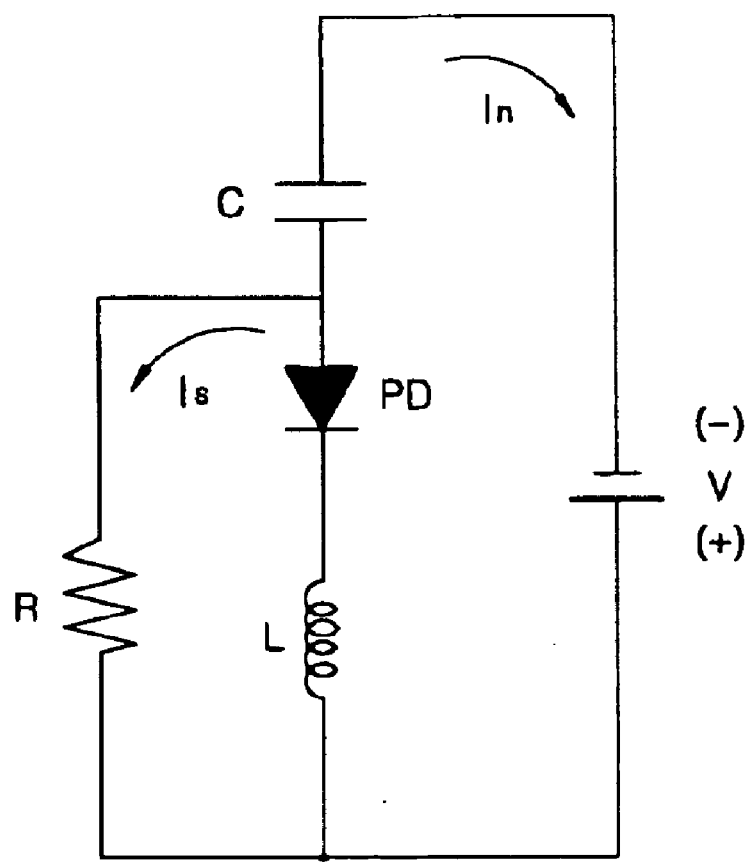
FIG. 6 illustrates a schematic circuit diagram of the photo detector as shown in FIG. 5.

FIG. 6 illustrates a schematic circuit diagram of the photo detector as shown in FIG. 5.

Referring to FIG. 6, a capacitor C, a photo detector structure PD, and an inductor L are connected in series, and the photo detector structure PD, the inductor L, and an external resistance R are connected in parallel. Here, unlike FIG. 5, the photo detector structure PD represents a semiconductor device that includes only the first semiconductor layer 33, the optical absorption layer 35, the amplification layer 37, and the second semiconductor layer 39, while excluding the upper electrode 31 and the lower electrode 41.

A cathode of a power supply V is coupled to the capacitor C and an anode of the power supply V is coupled to the inductor L. Noise current $I_n$ flows through the power supply V while only a signal current $I_S$ flows through the external resistance. A voltage V of the power supply, a voltage $V_L$ of the inductor L, an inductive reactance $X_L$ of the inductor L, and a capacitive reactance $X_C$ of the capacitor C are in a relationship as shown by the following Equation 1.

$$V_L = \frac{X_L}{X_L + X_C} V = \frac{jwL}{jwL + \frac{1}{jwC}} V \qquad \text{[Equation 1]}$$

As the capacitance of the capacitor C increases, $V_L$ approaches V. In addition, a high frequency noise of the power supply is filtered by the reactance $X_L$, which is inserted into a connecting portion between a light-receiving device and ground, because at a high frequency the circuit impedance becomes higher as the reactance $X_L$ increases. Accordingly, the photo detector of the present invention may be designed such that the value of the external resistance R is small, since only the signal current $I_s$ caused by light flows through the external resistance R. Further, because the inductor L and the capacitor C serve as a bandpass filter, the S/N ratio of the photo detector may be represented by the following Equation 2.

$$S/N = \frac{\overline{P_S}}{\overline{P_{NS}} + \overline{P_{NT}}} = \frac{\left(\frac{MeP\eta}{hv}\right)^2 X_L}{2M^2 e\Delta f \left(\frac{\eta eP}{hv} + I_D\right) X_L + 4kT\Delta f} \qquad \text{[Equation 2]}$$

Here, M is a gain, $\overline{P_{Ns}}$ is a shot noise power, $\overline{P_{NT}}$ is a thermal noise power, and $\overline{P_s}$ is a signal power. The photo detector according to the present invention may be designed to have a circuit structure for detecting a signal having a particular frequency band, thus improving frequency selectivity. In this circuit structure, the bandwidth $\Delta f$ and the inductive reactance $X_L$ are reduced to increase the S/N ratio of the photo detector.

As explained so far, in a photo detector according to the present invention, an upper electrode includes a capacitor and a lower electrode includes an inductor, thus forming an LC resonance circuit. Thus, noise is kept from an external resistance to increase the S/N ratio of the photo detector.

Also, a capacitor includes a plurality of thin conductive layers and a plurality of thin dielectric layers that are stacked. Thus, the capacitor may serve as an optical filter that filters light having a particular wavelength band.

Preferred embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A photo detector device, comprising:
    a transparent upper electrode including a capacitor;
    a first semiconductor layer disposed under the upper electrode;
    an optical absorption layer disposed under the first semiconductor layer for absorbing light to generate pairs of electrons and holes;
    an amplification layer disposed under the optical absorption layer for generating secondary electrons;
    a second semiconductor layer disposed under the amplification layer; and
    a lower electrode disposed under the second semiconductor layer and including an inductance coupled in parallel with an external resistance.

2. The device as claimed in claim 1, wherein the capacitor includes a plurality of thin dielectric layers between two thin conductive layers and serves as an optical filter that filters light having a particular wavelength band.

3. The device as claimed in claim 2, wherein the thin conductive layer is formed of one of ITO and ZnO.

4. The device as claimed in claim 2, wherein the thin dielectric layer is formed of one of SiO2 and SiNx.

5. The device as claimed in claim 2, wherein a first bonding pad being in ohmic contact with an external power supply and a second bonding pad being in ohmic contact with the external resistance are attached to the surface of the upper electrode.

6. The device as claimed in claim 5, wherein the upper electrode comprises:
    a first circular electrode formed at the center of the upper electrode where the first bonding pad being in ohmic contact with the external power supply is attached;
    a second circular electrode which is spaced apart from the first circular electrode by a predetermined distance and formed where the second bonding pad being in ohmic contact with the external resistance is attached; and
    a circular insulating layer disposed between the first circular electrode and the second circular electrode.

7. The device as claimed in claim 1, wherein the lower electrode includes an insulating layer having a spiral coil to serve as an inductor.

8. The device as claimed in claim 7, wherein a hole is formed in the lower electrode to be in ohmic contact with an external device.

9. The device as claimed in claim 1, wherein the first semiconductor layer is formed of a p+-type semiconductor layer.

10. The device as claimed in claim 1, wherein the amplification layer is formed of a p-type semiconductor layer.

11. The device as claimed in claim 1, wherein the second semiconductor layer is formed of an n-type semiconductor layer.

* * * * *